United States Patent
Bonilla et al.

(10) Patent No.: US 9,287,185 B1
(45) Date of Patent: Mar. 15, 2016

(54) DETERMINING APPROPRIATENESS OF SAMPLING INTEGRATED CIRCUIT TEST DATA IN THE PRESENCE OF MANUFACTURING VARIATIONS

(71) Applicant: International Business Machines Corporation, Armonk, NY (US)

(72) Inventors: Griselda Bonilla, Hopewell Junction, NY (US); Baozhen Li, South Burlington, VT (US); Barry P. Linder, Hastings-On-Hudson, NY (US); James H. Stathis, Poughquag, NY (US); Ernest Y. Wu, Essex Junction, VT (US); Kai Zhao, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/753,771

(22) Filed: Jun. 29, 2015

(51) Int. Cl.
H01L 21/00 (2006.01)
H01L 21/66 (2006.01)
G01R 31/28 (2006.01)

(52) U.S. Cl.
CPC ........... *H01L 22/14* (2013.01); *G01R 31/2894* (2013.01); *H01L 22/12* (2013.01)

(58) Field of Classification Search
CPC ....... H01L 22/14; H01L 22/12; G01R 31/289
See application file for complete search history.

(56) References Cited

U.S. PATENT DOCUMENTS

| | | | |
|---|---|---|---|
| 4,739,258 A * | 4/1988 | Schwarz | G01R 27/02 324/537 |
| 5,552,996 A * | 9/1996 | Hoffman | B24B 37/005 216/38 |
| 7,230,812 B2 | 6/2007 | Alam et al. | |

(Continued)

FOREIGN PATENT DOCUMENTS

| CN | 102221668 B | 5/2013 |
|---|---|---|
| JP | 2007258488 A | 10/2007 |

OTHER PUBLICATIONS

IBM, "Method for Electrical Determination of Interconnect Uniformity and Defect Distribution for Deep Sub-Micron Back End of Line (BEOL) Manufacturing", Sep. 18, 2009, IP.com No. 00088017, 6 pages.

(Continued)

*Primary Examiner* — Laura Menz
(74) *Attorney, Agent, or Firm* — Gibb & Riley, LLC; Anthony J. Canale

(57) ABSTRACT

Methods and systems determine an original statistical variance of an original failure distribution of a component (that is common to all chips tested) that occurs during manufacturing of wafers containing such chips. These methods and systems determine a first statistical variance of a reconstructed failure distribution, relative to sample size; and determine a second statistical variance of a mean time to failure of the component, relative to sample size. The first and second statistical variances are combined into a total reconstruction variance. Methods and systems determine whether the original statistical variance is less than the total reconstruction variance to identify whether the process of creating the reconstructed failure distribution can be used. Therefore, these methods and systems prohibit testing of the additional wafers manufactured using the specific wafer design and manufacturing process when on the original statistical variance is less than the total reconstruction variance.

20 Claims, 21 Drawing Sheets

(56) References Cited

U.S. PATENT DOCUMENTS

| | | | |
|---|---|---|---|
| 7,298,161 | B2 | 11/2007 | Bernstein et al. |
| 7,415,386 | B2 * | 8/2008 | Burch .................. G05B 23/024 438/17 |
| 7,447,606 | B2 * | 11/2008 | Agarwal ................. H01L 22/14 324/762.05 |
| 9,018,089 | B2 * | 4/2015 | Liniger ............ H01L 21/76828 257/E21.241 |
| 2004/0254752 | A1 * | 12/2004 | Wisniewski ............ H01L 22/20 702/84 |
| 2006/0259279 | A1 * | 11/2006 | Ayala ............... G05B 19/41875 702/187 |
| 2007/0185683 | A1 | 8/2007 | Foo et al. |
| 2007/0288185 | A1 * | 12/2007 | Burch .................. G05B 23/024 702/81 |
| 2009/0075472 | A1 * | 3/2009 | Arnold ............. H01L 21/02063 438/623 |
| 2009/0143999 | A1 * | 6/2009 | Karthikeyan ........ G01R 35/005 702/58 |
| 2009/0294901 | A1 * | 12/2009 | Bonilla ............... H01L 23/5256 257/529 |
| 2010/0017009 | A1 * | 1/2010 | Baseman ........... G05B 19/0428 700/109 |
| 2011/0031981 | A1 | 2/2011 | Tsujikawa |
| 2011/0178624 | A1 * | 7/2011 | Baseman ............... G06N 5/025 700/104 |
| 2013/0049207 | A1 * | 2/2013 | Liniger ............ H01L 21/76828 257/773 |
| 2013/0339919 | A1 * | 12/2013 | Baseman ......... G05B 19/41875 716/136 |
| 2014/0351785 | A1 | 11/2014 | Li et al. |
| 2015/0061724 | A1 | 3/2015 | Mittl et al. |

OTHER PUBLICATIONS

Wu et al., "On the Weibull Shape Factor of Intrinsic Breakdown of Dielectric Films and Its Accurate Experimental Determination—Part I: Theory, Methodology, Experimental Techniques", IEEE Transactions on Electron Devices, vol. 49, No. 12, Dec. 2002, pp. 2131-2140.

Xin-Yao et al., "Lifetime Prediction with Small Samples Data from Weibull Distribution", International Journal of Advancements in Computing Technology (IJACT), vol. 4, No. 13, Jul. 2012, pp. 164-171.

* cited by examiner

US 9,287,185 B1

DETERMINING APPROPRIATENESS OF SAMPLING INTEGRATED CIRCUIT TEST DATA IN THE PRESENCE OF MANUFACTURING VARIATIONS

FIELD OF INVENTION

The present invention relates to performing sample testing during manufacturing and/or qualification a wafer using a wafer design and a manufacturing process that uses wafer manufacturing machines.

BACKGROUND

Sampling methodologies allow less than all components on an integrated circuit device to be tested, thereby substantially reducing testing time as well as saving computer resources that are associated with calculating results based upon the actual physical testing of the integrated circuit devices. One sampling-based technique is a methodology to reconstruct a Weibull distribution to solve variability issues related to breakdown (BD) statistics. While this method has been shown to be successful in $SiO_2$ with small thickness ($T_{OX}$) variation, its applicability remains questionable, particularly for middle of line/back end of line (MOL/BEOL) dielectrics with substantial spacing variation and intrinsic line-edge roughness (LER).

SUMMARY

According to various embodiments of the present invention herein, methods and systems herein manufacture a wafer using a wafer design and a manufacturing process that uses wafer manufacturing machines. The wafer design can contain identically designed integrated circuit chips. Various methods, systems, and computer program products herein test the manufactured wafer to produce test data. Using the test data, such methods, systems, and computer program products herein determine an original failure distribution of a component of the wafer (that is common to all of the integrated circuit chips, such as insulator thickness) based on the test data; and determine an original statistical variance of the original failure distribution of the component that occurs during the manufacturing of the wafer. This original statistical variance can be a chip-to-chip variance, a device-to-device variance, etc., and is based on empirical (actual physical) testing of the manufactured integrated circuit chips.

Additionally, such methods perform a process of creating a reconstructed failure distribution of the component using a sample size of the test data that are less than all of the test data. More specifically, in the sampling sizes these methods select the number of integrated circuit chips per wafer to sample (that are less than all of the integrated circuit chips in the wafer design) and select the number of devices per integrated circuit chip to sample (that are less than all of the devices in the integrated circuit chips in the wafer design). Thus, while both the test data and the sample sizes comprise the test data from a limited number of integrated circuit chips per wafer and a limited number of devices per integrated circuit chip, all of the test data is much larger (a large multiple of) the sampling sizes; and use of the much smaller sampling sizes can save computer resources and time when performing sample-based testing the wafer design and manufacturing process.

In order to evaluate whether it is appropriate to perform testing of the specific wafer design and manufacturing process using the reconstructed failure distribution of the component generated with the smaller sampling sizes, these methods determine a first statistical variance of the reconstructed failure distribution relative to sample size; and determine a second statistical variance of a mean time to failure of the component relative to sample size, again using all of the test data. These methods then combine the first statistical variance and the second statistical variance into a total reconstruction variance.

Further, such methods determine whether the original statistical variance is less than the total reconstruction variance to identify whether additional wafers manufactured according to the specific wafer design and manufacturing process can be subjected to sample-based testing using the process of creating the reconstructed failure distribution with the smaller sampling sizes. Therefore, these methods prohibit such sample-based testing of the additional wafers when the original statistical variance is less than the total reconstruction variance, but permit such sample-based testing of the additional wafers when the original statistical variance is not less than the total reconstruction variance.

In additional embodiments, these methods can alter the sample sizes to include more samples based on identifying that the process of creating the reconstructed failure distribution of the component cannot be used.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, a sampling-based technique can be used as a methodology to reconstruct a Weibull distribution to solve variability issues related to breakdown (BD) statistics. While this method has been shown to be successful in $SiO_2$ with small thickness ($T_{OX}$) variation, its applicability remains questionable, particularly for MOL/BEOL dielectrics with substantial spacing variation and intrinsic line-edge roughness (LER) because this method requires four assumptions to be validated (in Table 1) see below.

TABLE 1

Assumptions of Reconstruction Methodology:

1). Local (in-die) BD distributions must be Weibull-distributed and Non-Weibull or bimodal distributions within chips are not valid
2). Poisson are-scaling is assumed for all local (in-die) distributions.
3). TBD data are collected with sufficient accuracy.
4). Constant Weibull slopes for all in-die TBD distributions.

In other words, only $T_{63}$ varies from dies to dies but β is fixed. This means this is an approximation procedure and only valid for very small TOX variation since percolation theory inherently links $T_{63}$ with β through thickness/spacing dependence of $T_{63}$ and β.

As noted above, a sampling-number dependence of Weibull slope (β) has been recently reported; however, its applicability remains questionable. As a result, to obtain accurate β value, a large number of samples are required. Moreover, it is shown that the reconstructed distribution with a small sampling number can be misleading as it masks the non-Weibull/non-Poisson area-scaling nature of underlying in-die TBD distributions, revealed by extraordinary statistics of ~10,000 samples. Methods described herein, reveal statistical scaling property for the β-sampling curve, along with a new result of sampling-number dependence of $T_{63}$ variation. These methods can report a fundamental mathematical formulation for these two sampling-number dependencies of Weibull slope and $T_{63}$ variations. As a result, a quantitative criterion for the applicability of reconstruction methodology is developed.

Figure 1A:
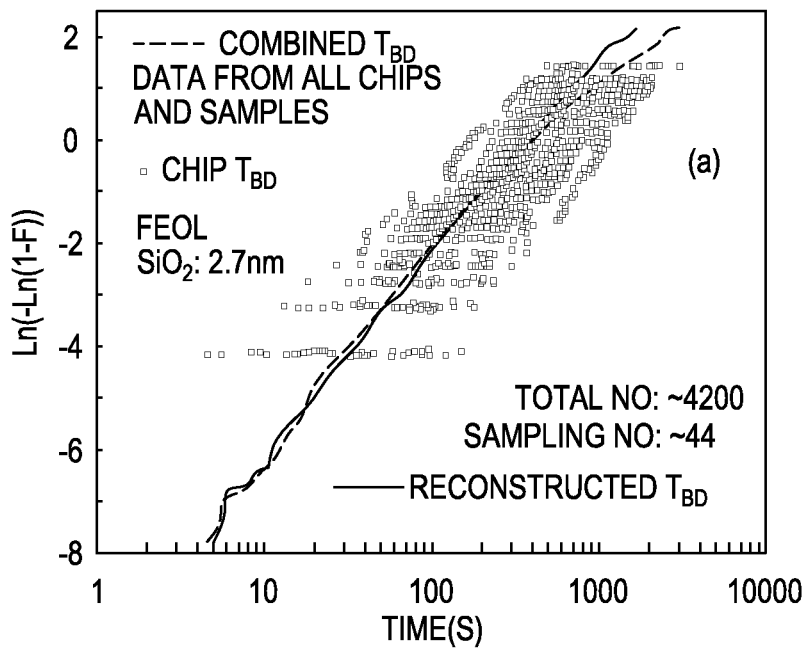
FIG. 1A is a graph demonstrating methods herein.
Figure 1B:
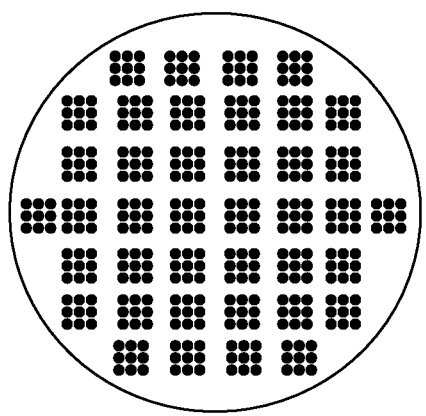
FIG. 1B is a schematic diagram of a wafer.
Figure 2A:
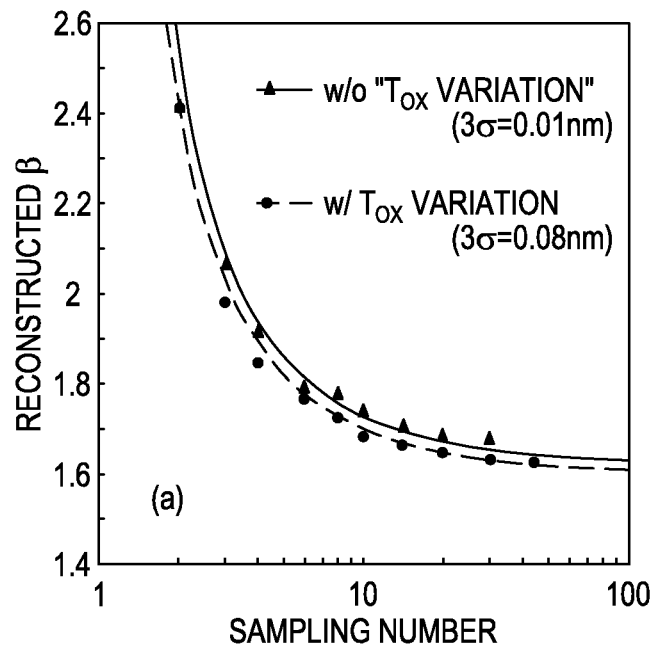
FIG. 2A-B are graphs demonstrating methods herein.

FIGS. 1A-B show some typical TBD distributions of front-end-of-line (FEOL) 27 Å $SiO_2$ at chip level, the combined TBD data across the wafer, and the reconstructed distribution using sampling-based methodology. In this case, a large sampling number of 44 devices per chip are used with a total of ~4200 samples. The sampling-number (n) dependence of Weibull slope (β) is shown in FIG. 2A for two cases with and without $T_{OX}$ variation. It can be seen in FIG. 2A that β sampling-number dependence is comparable for these two cases, supporting the original concept of this methodology.

Figure 2B:
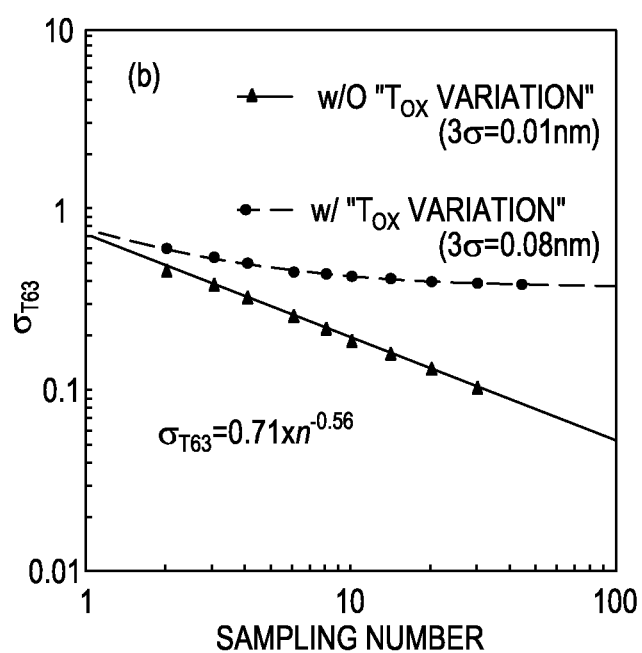
Figure 3A:
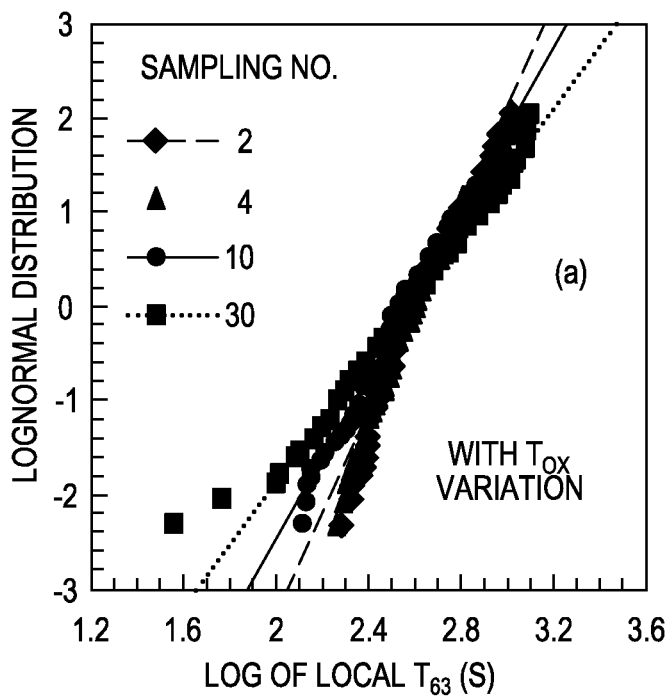
FIG. 3A-B are graphs demonstrating methods herein.
Figure 3B:
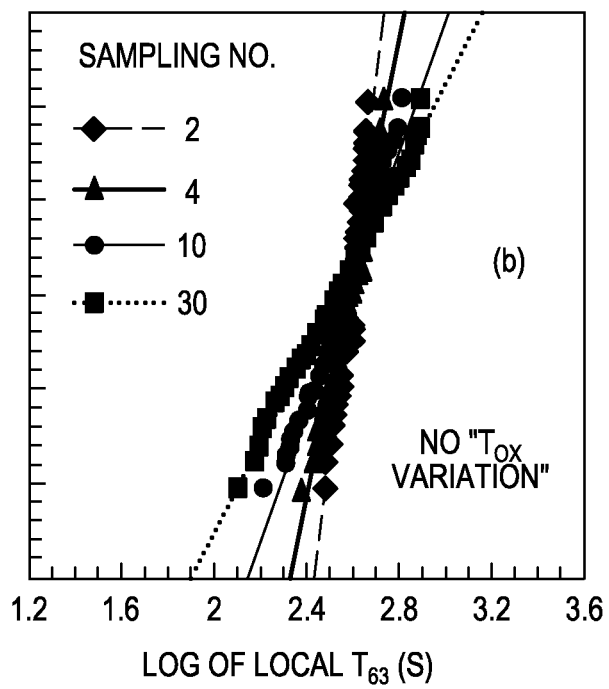

To understand its root-cause, methods plot the standard deviation (σ) of local $T_{63}$ (in-die) in FIG. 2B showing remarkable differences in these two cases along with the corresponding log normal plots of local $T_{63}$ values given in FIGS. 3A-B. As seen in FIG. 3B, for no $T_{OX}$ variation case, the local $T_{63}$ values varies with the sampling number as $\sim n^{0.5}$ consistent with the central-limited theory. In contrast, with $T_{OX}$ variation shown in FIG. 3A, the σ of local $T_{63}$ decreases slightly with increasing sampling-number (n) but remains almost saturated towards large n values.

Figure 4A:
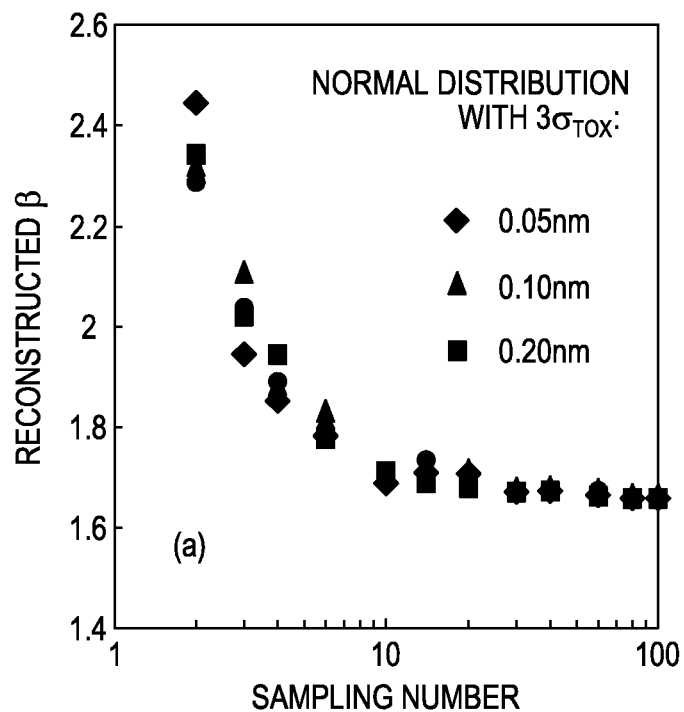
FIG. 4A-B are graphs demonstrating methods herein.
Figure 4B:
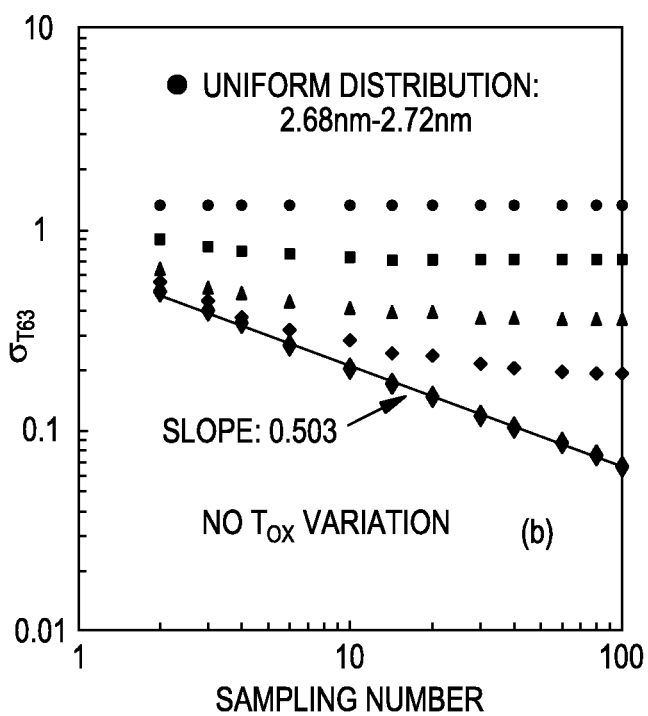

To deepen the understanding, methods perform Monte Carlo (MC) simulations with different $T_{OX}$ distributions (uniform vs. normal distributions with different a $T_{ox}$) with a mean $T_{OX}$ value of 2.7 nm and also a case without any $T_{OX}$ variation. Both sampling-number dependencies of β and σ $T_{63}$ are consistent with the MC simulation as seen in FIGS. 4A-B. Table 2 (see below) summarizes the equations methods and system herein use for statistical models of sampling number (n) dependence of β and $T_{63}$ variation ($\sigma_{T63}$).

TABLE 2

Theoretical Formulation of Reconstructed Variances.

$$\text{Var}_{WB} = \text{Var}(\beta) + \text{Var}_{T_{63\_WB}} \quad (1)$$

$$\text{Var}_{WB} = \Gamma\left(1 + \frac{2}{\beta}\right) - \left[\Gamma\left(1 + \frac{1}{\beta}\right)\right]^2 \quad (2)$$

$$\text{Var}_{T_{63\_WB}} = \frac{\sigma_0^2}{n} \quad (3)$$

$$\text{Var}(\beta) = \text{Var}_{WB}(\beta_\infty) - \frac{\sigma_0^2}{n} \quad (4)$$

$$\beta(n) = \beta^{-1}[\text{Var}(\beta)] \quad (4A)$$

$$\text{Var}_{T63} = \frac{\sigma_0^2}{n} + \sigma_{T_{63}\infty}^2 \quad (5)$$

$$\text{Var}_{tot\_recon} = T_{63\_Rec}^2(\text{Var}_1 + \text{Var}_2) \quad (6)$$

$$\text{Var}_1 = \text{Var}(\beta_\infty) - \frac{\sigma_1^2}{n} \quad (7)$$

$$\text{Var}_2 = \frac{\sigma_2^2}{n} + \sigma_{T_{63}\infty}^2 \quad (8)$$

$$\text{Var}_{tot\_recon} = T_{63\_Rec}^2\left(\text{Var}(\beta_\infty) + \sigma_{T_{63}\infty}^2\right) \quad (9)$$

$$\text{Var}_{Original} \geq \text{Var}_{tot\_Rec} \quad (10)$$

Figure 13A:
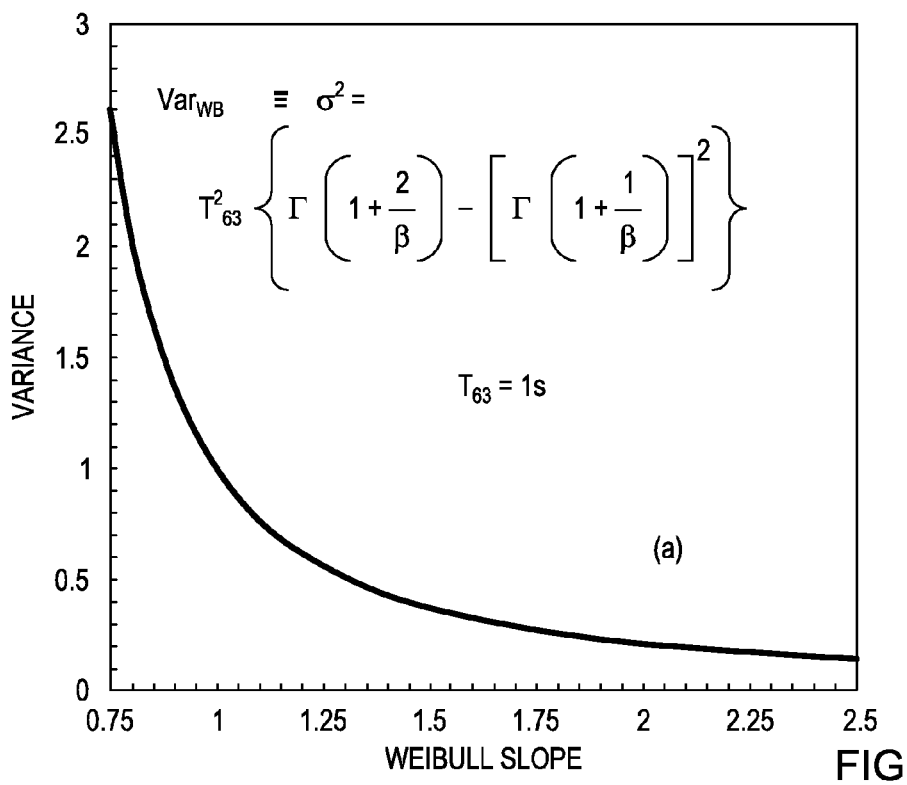
FIG. 13A-B are graphs demonstrating methods herein.
Figure 13B:
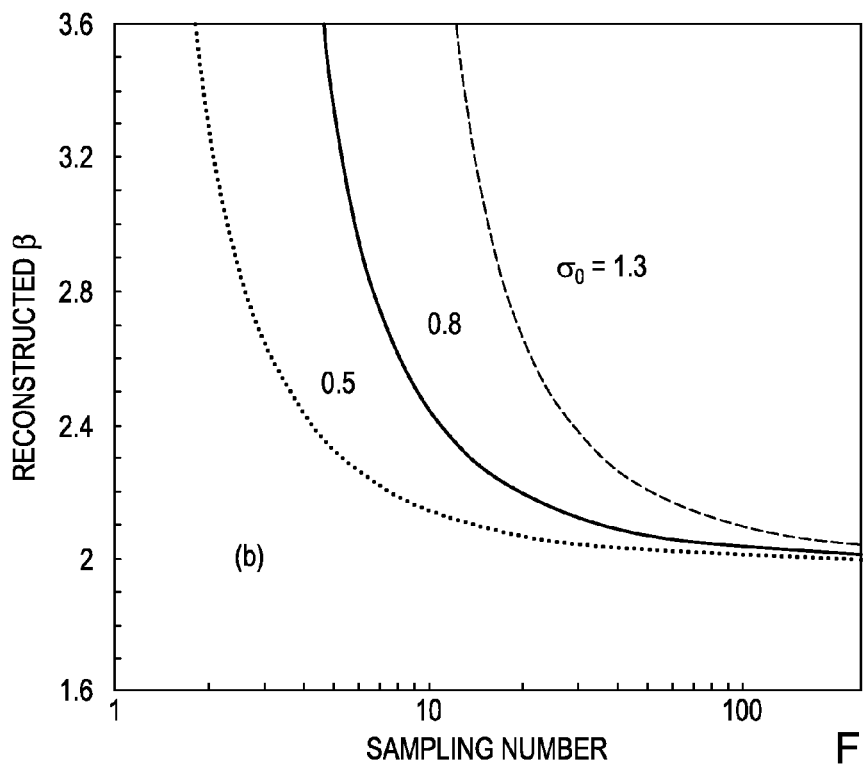

Total variance of two independent sources of variations can be written as where $\text{Var}_{WB}$ is the variance of Weibull distribution and the variance of central-limited theory are given respectively: since no Tox variation after reconstruction, the variance is that of Weibull, and also that it is fixed quantity and independent of sampling number. The sampling-number dependence of Weibull-slope can be shown as a graph of $\text{Var}_{WB}$ of Equation 2 is given in FIG. 13A. Equation 4 is numerically solved by inverting Equation 2 to obtain Equations 4A given in FIG. 13B with various $\sigma_0$ values. The sampling-number dependence of $T_{63}$ variation assuming a log normal distribution can be shown: where $\sigma_{T63\infty}$ is the σ of log normal distribution. The total reconstructed variance for general applications where η is the reconstructed $T_{63}$ and for log normal distribution for $T_{63}$ variation, we have $\sigma_0 = \sigma_1 = \sigma_2$. For general cases with $\sigma_0 \neq \sigma_1 \neq \sigma_2$ Equation (9) still holds as $n \to \infty$. Equation 10 provides a quantitative criterion for applicability of reconstruction methods. $\text{Var}_{original}$ is the variance of an original distribution can be determined.

Since methods deal with Weibull, and/or log normal, and other distributions here, the variance analysis provides a general framework to characterize the spread of any arbitrary distributions. The agreement of statistical model to $SiO_2$ data with and without $T_{OX}$ variation is excellent as shown in FIG. 2A. The σ0 value of 0.60 is also comparable to 0.71 extracted from the central limit theory in FIG. 2B due to a small 3σ=0.01 nm even for no $T_{OX}$ variation case. These results explain the root-cause of β-sampling curve β(n), arising from subgroup sampling as dictated by central limit theory. This is a systematic effect rather than stochastic fluctuation effect from conventional sample-size. The β value at $n \to \infty$ corresponds to the Weibull slope of reconstructed distribution by properly taking this systematic effect of sampling-number dependence into account.

Figure 5:
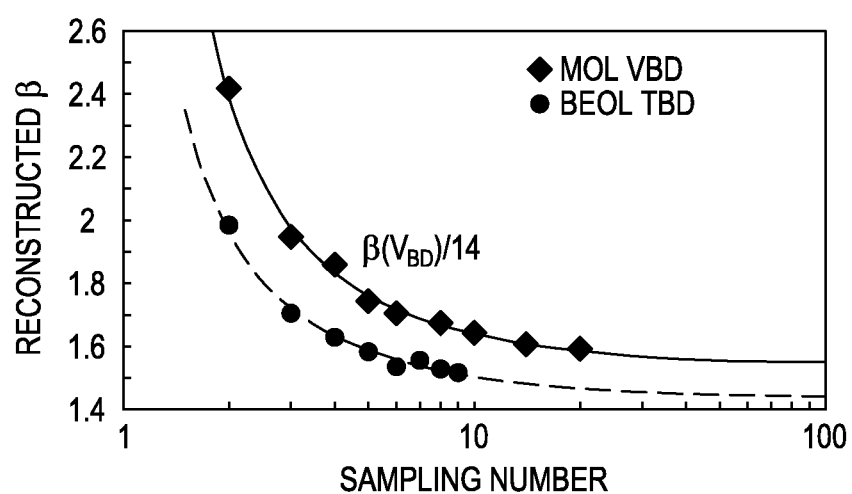
FIG. 5 is a graph demonstrating methods herein.

Further, Equation 4 provides an accurate method to determine the $\beta_\infty$ using only a few small sampling numbers. This effect should be properly included in reliability extrapolation since $\beta$ values can strongly affect the projection results. FIG. 5 shows its comparison of statistical model with BEOL/MOL data.

Figure 6A:
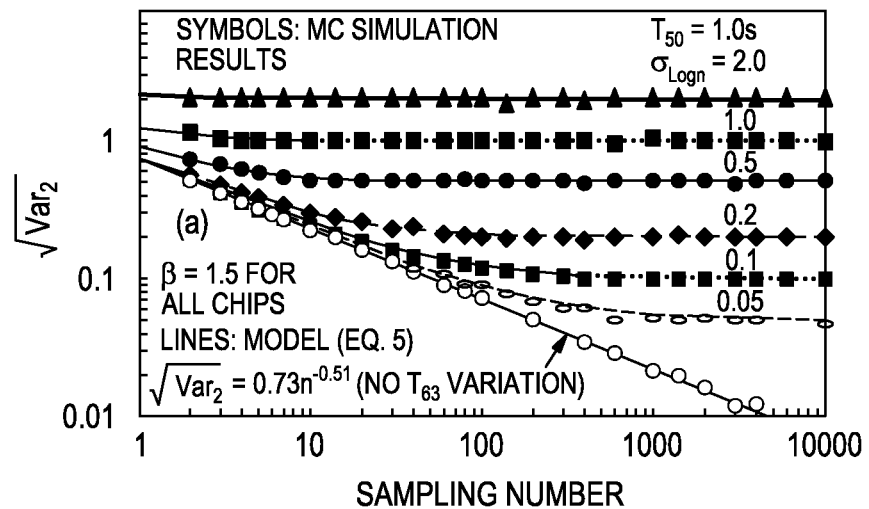
FIG. 6A-B are graphs demonstrating methods herein.
Figure 6B:
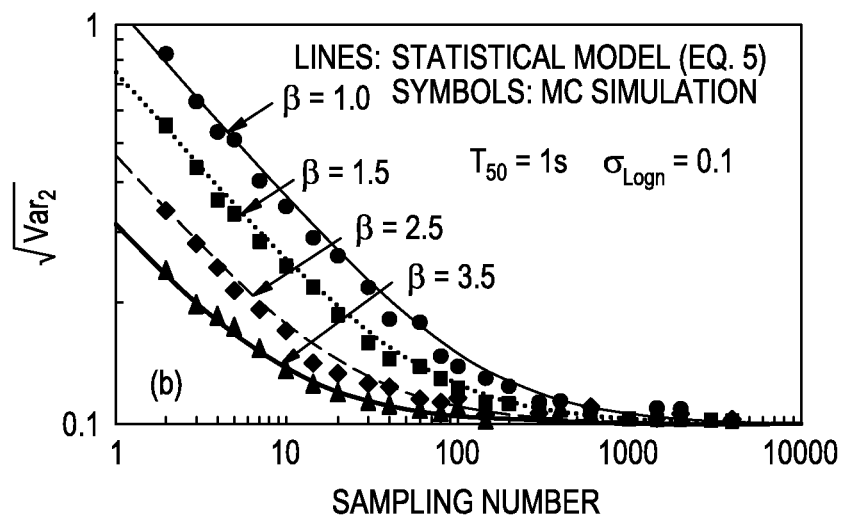

In the case of larger $T_{OX}$ variation, the $\sigma$ for $T_{63}$ variation in FIG. 2B shows a much weaker dependence on sampling-number (n). To understand its root-cause, methods perform MC simulation assuming $T_{63}$ variation follows a log normal distribution but changing $\sigma_{Log\ n}$ with a fixed $\beta=1.5$. The MC results in FIG. 6A reveal the variance of $T_{63}$ from chips to chips gradually approach the case of no $T_{63}$ variation as $\sigma_{Log\ n}$ is reduced. In contrast, for larger $\sigma_{Log\ n}$ values, $\sigma_{T63}$ only weakly depends on n, similar to the case with $T_{OX}$ variation in FIG. 2B. The lines in FIG. 6A agree well with the analytical solution of Equation 5. FIG. 6B shows the effect of changing $\beta$ coincides with the $\sigma_0$ value in Equation 5 while the $T_{50}$ magnitude is insensitive to the $T_{63}$ variance.

FIG. 2B shows the comparison of Equation 5 with $SiO_2$ data including $T_{OX}$ variation. These results suggest as $T_{63}$ variation is included, a non-vanishing $\sigma_{T63\infty}$ exists regardless of sampling-number and this should be taken into account in this reconstruction methodology.

Figure 7:
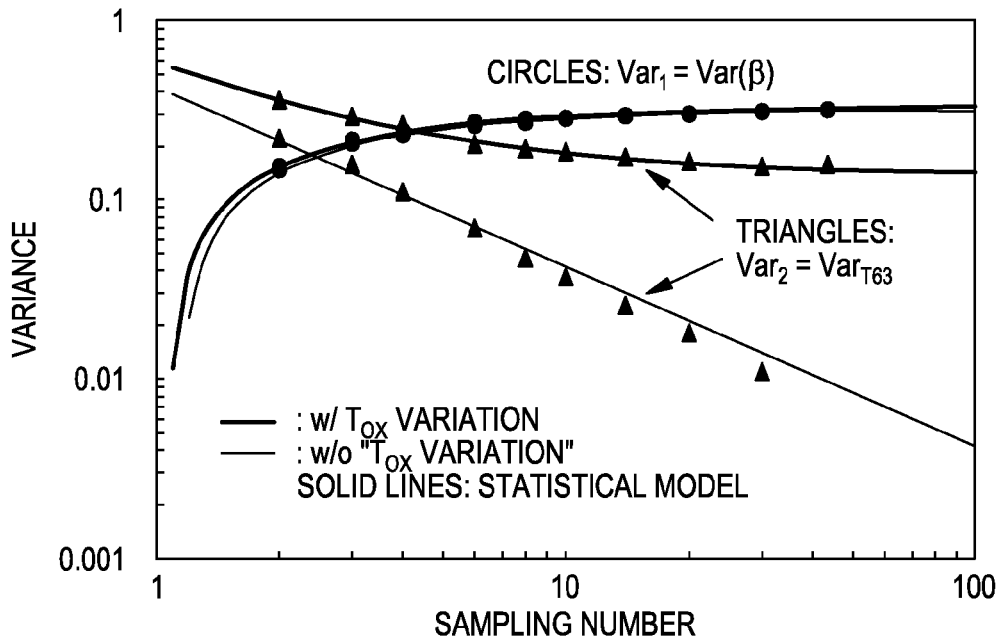
FIG. 7 is a graph demonstrating methods herein.
Figure 8:
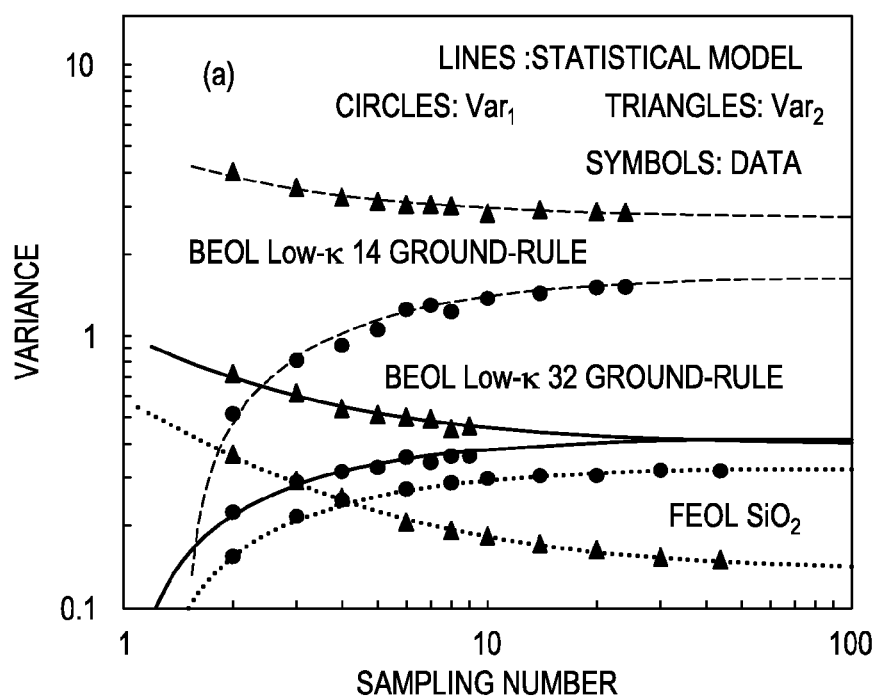
FIG. 8 is a graph demonstrating methods herein.

FIG. 7 compares the relative contributions of two terms of Equation 6 for $SiO_2$ with and without $T_{OX}$ variation, showing $\beta$-sampling effect (1st term) dominates over $T_{63}$ variation. Notice that variance of $\beta$ change increases with n due to the inverse relation between $Var_{WB}$ and $\beta$ (FIG. 14A). FIG. 8 shows comparison of two variance components (Var1, Var2) for extrinsic BD case and intrinsic BD case using $SiO_2$ oxides (BEOL Low-k 14 ground rule, BEOL low-k 32 ground rule, and FEOL $SiO_2$).

Figure 9:
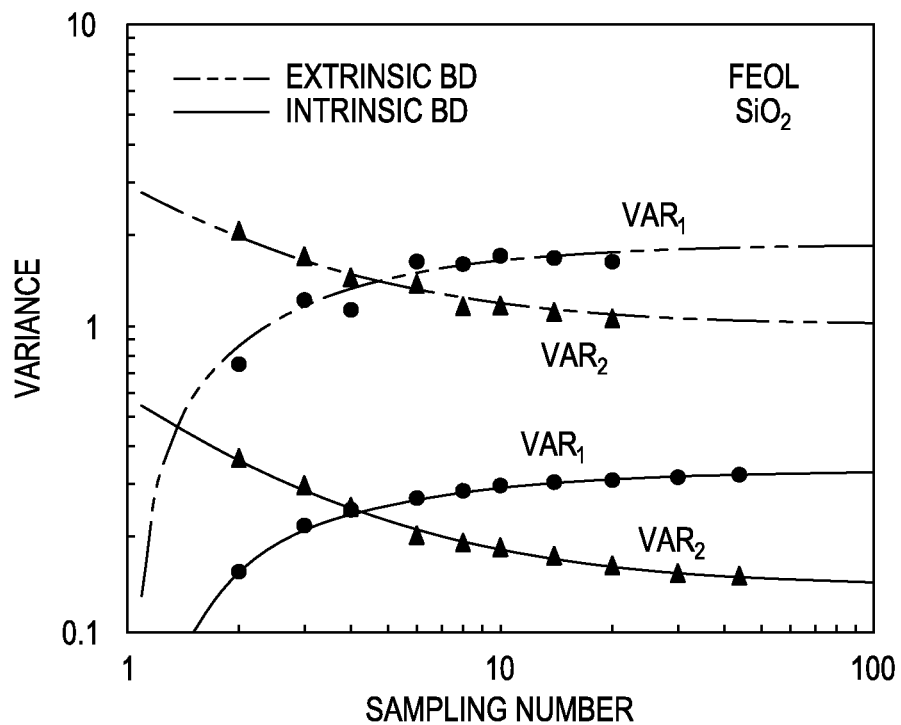
FIG. 9 is a graph demonstrating methods herein.
Figure 10:
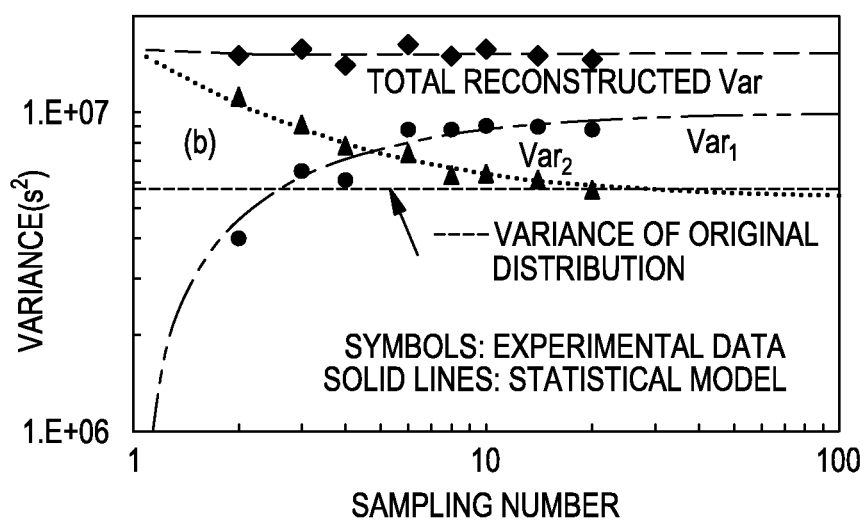
FIG. 10 is a graph demonstrating methods herein.

FIG. 8 shows the both variance terms for extrinsic BD dominate in comparison with intrinsic BD case. The variance methodology outlined in Table 2 (above) also allows one to compare FEOL data with BEOL data. FIG. 9 reveals as n→∞, both variance terms approach comparable for BEOL 32 ground-rule data but remain much higher than those of FEOL $SiO_2$, suggesting that thickness variation for BEOL is more much worse than those of FEOL dielectrics as expected. FIG. 10 illustrates the variance squared over sampling number, where the top diamond line represents total reconstructive variance, the triangle line represents one variance (Var2), the dotted line represents a different variance (Var1), and the dashed line represents the variance of the original distribution. As can be seen, when the two variances (Var1 and Var2) are added together, to achieve the total reconstructed variance, it positions the total reconstructed variance above the variance of the original distribution. As scaling continues to 14 ground-rule technology, both variance contributions terms remain higher than 32 ground-rule, pointing out more challenging tasks for variability reduction for 10 nm and 7 nm technologies ahead. With these fundamental understandings, the systems and methods herein establish a quantitative criterion for its applicability to BEOL/MOL/FEOL dielectrics, as discussed above, the reconstruction (FIG. 1B) is an approximation procedure to reconstruct a Weibull distribution as if no $T_{OX}$ variation from generally complicated and unknown sources of variations although thickness variation is often considered a primary source. Since the variance of the original distribution is a fixed quantity and does not depend on sampling number.

Figure 11A:
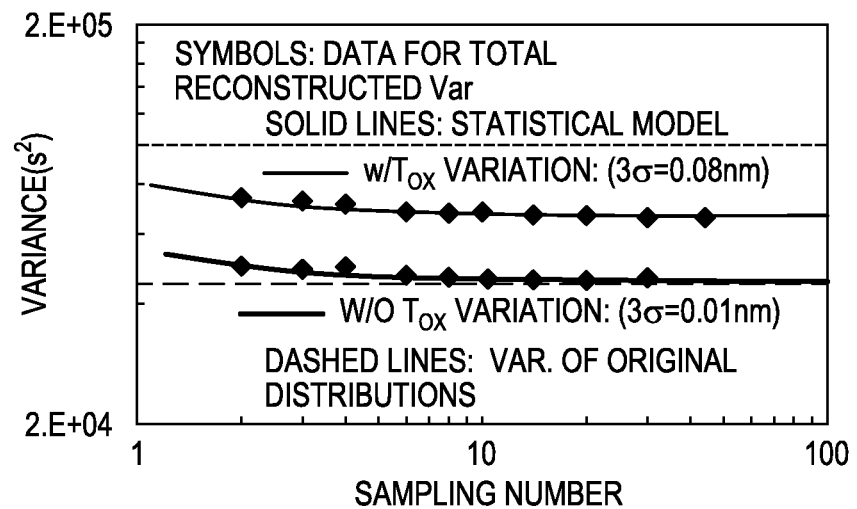
FIG. 11A-B are graphs demonstrating methods herein.
Figure 11B:
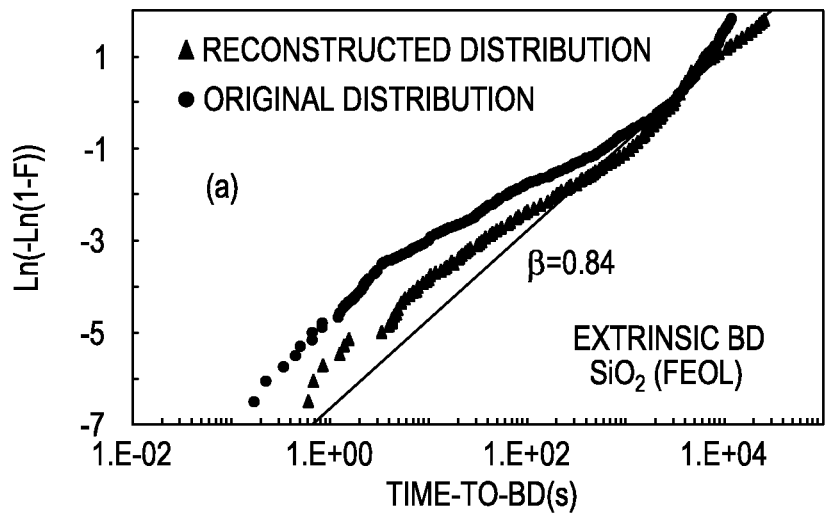
Figure 12A:
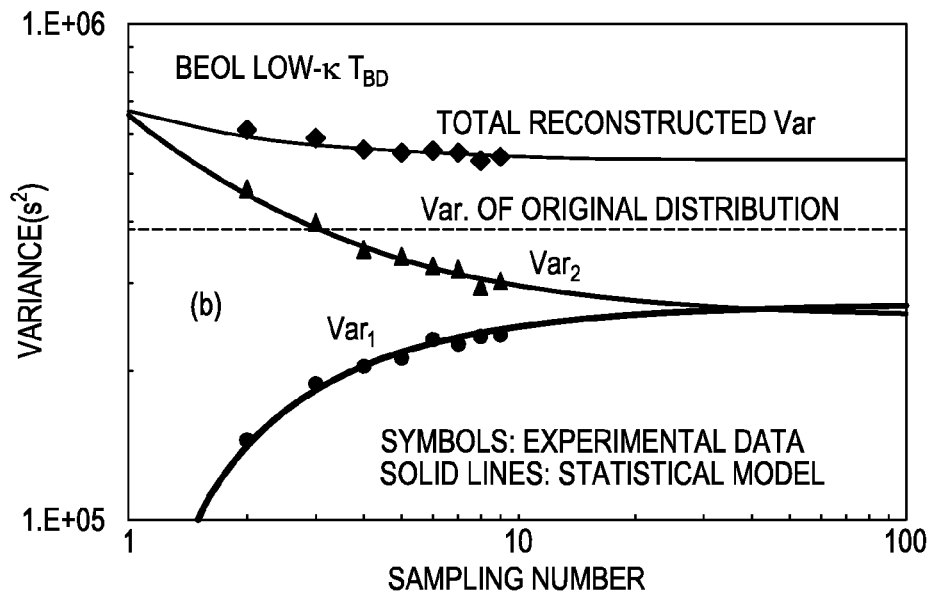
FIG. 12A-B are graphs demonstrating methods herein.
Figure 12B:
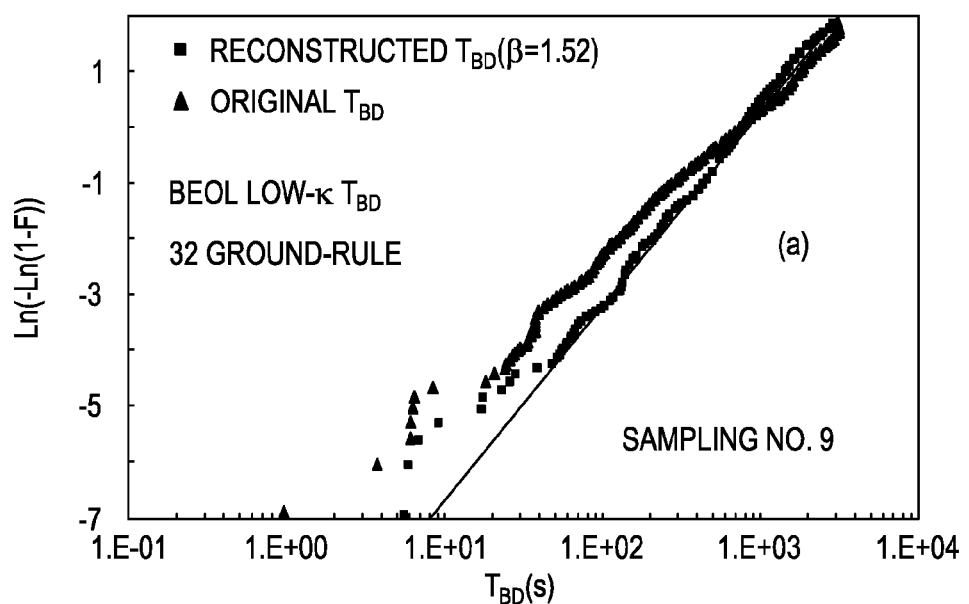

A minimum quantitative criterion is that reconstructed total variance cannot exceed that of this original distribution as given by Equation 10. The original distributions and reconstructed distributions for three examples are given in FIGS. 1A, 11B, and 12B. A full comparison for the different contributions of variance terms including the variances of the original distributions are given in FIGS. 11A, 11B, 12A for three cases. For FEOL $SiO_2$ of intrinsic BD with small $T_{OX}$ variations, this method works extremely well as shown in FIG. 11A. The cases of FEOL $SiO_2$ with extrinsic BD and BEOL intrinsic BD fail to meet this criterion suggesting method cannot be applied even though it gives an attractive $\beta$ values or there constructed distribution appears to Weibull (FIG. 12A).

Methods develop fundamental understanding for statistical properties of reconstruction methodology in full agreement with experimental data. Thus, a quantitative criterion for the applicability of this methodology is provided to guide reliability assessment and technology, particularly relative for future technology generations.

Figure 14:
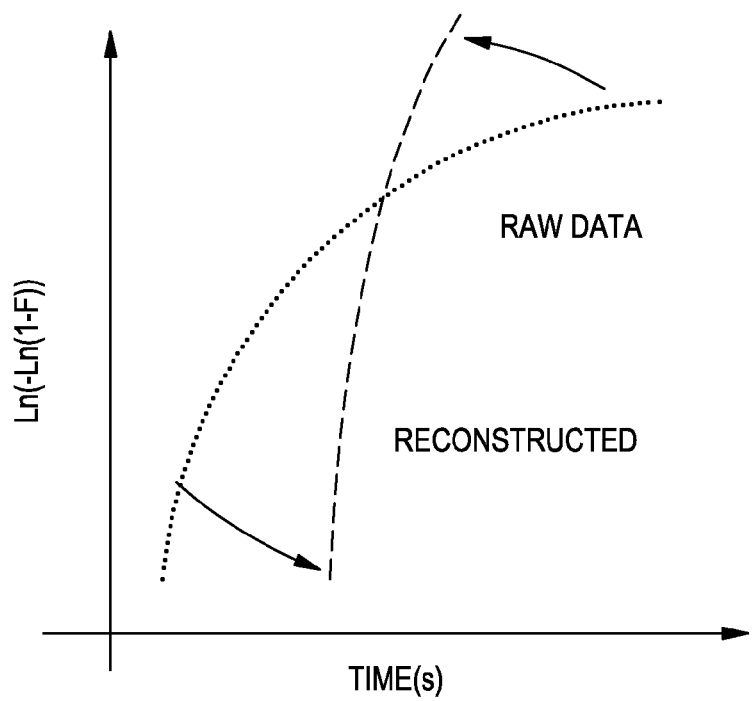
FIG. 14 is a graph demonstrating methods herein.
Figure 15:
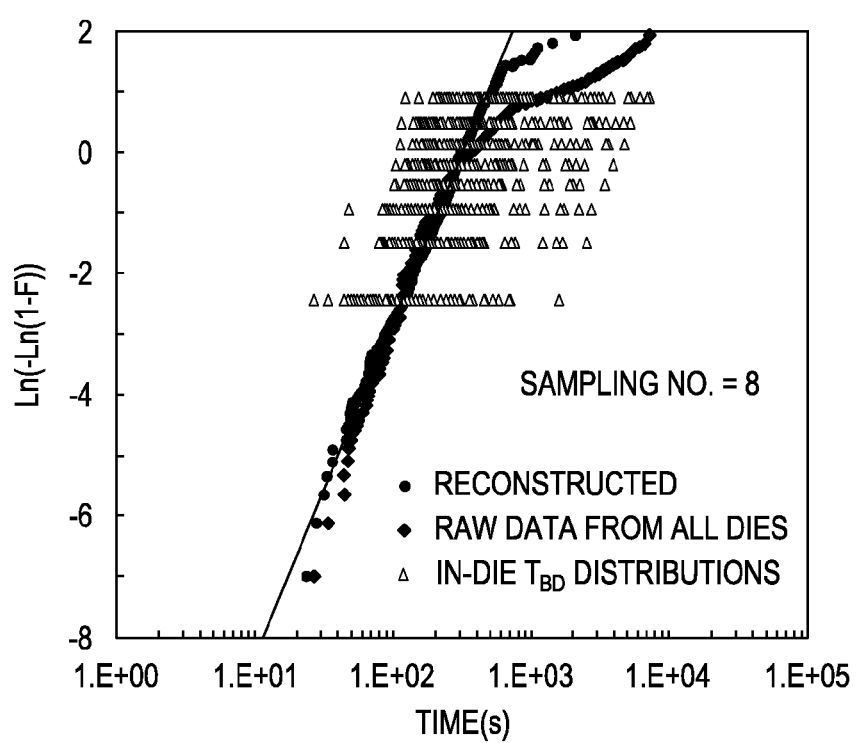
FIG. 15 is a graph demonstrating methods herein.

In FIG. 14 demonstrates the main features and effects of the reconstruction method and how raw data and reconstructed data are related over time. In FIG. 15 the small sampling number gives a good impression but masks the underlying skewed $T_{BD}$ data. For additional information on masking underlying skewed data, see Wu, et al. IEEE International Reliability Physics Symposium, p. 3A2.2, 2015.

Figure 16:
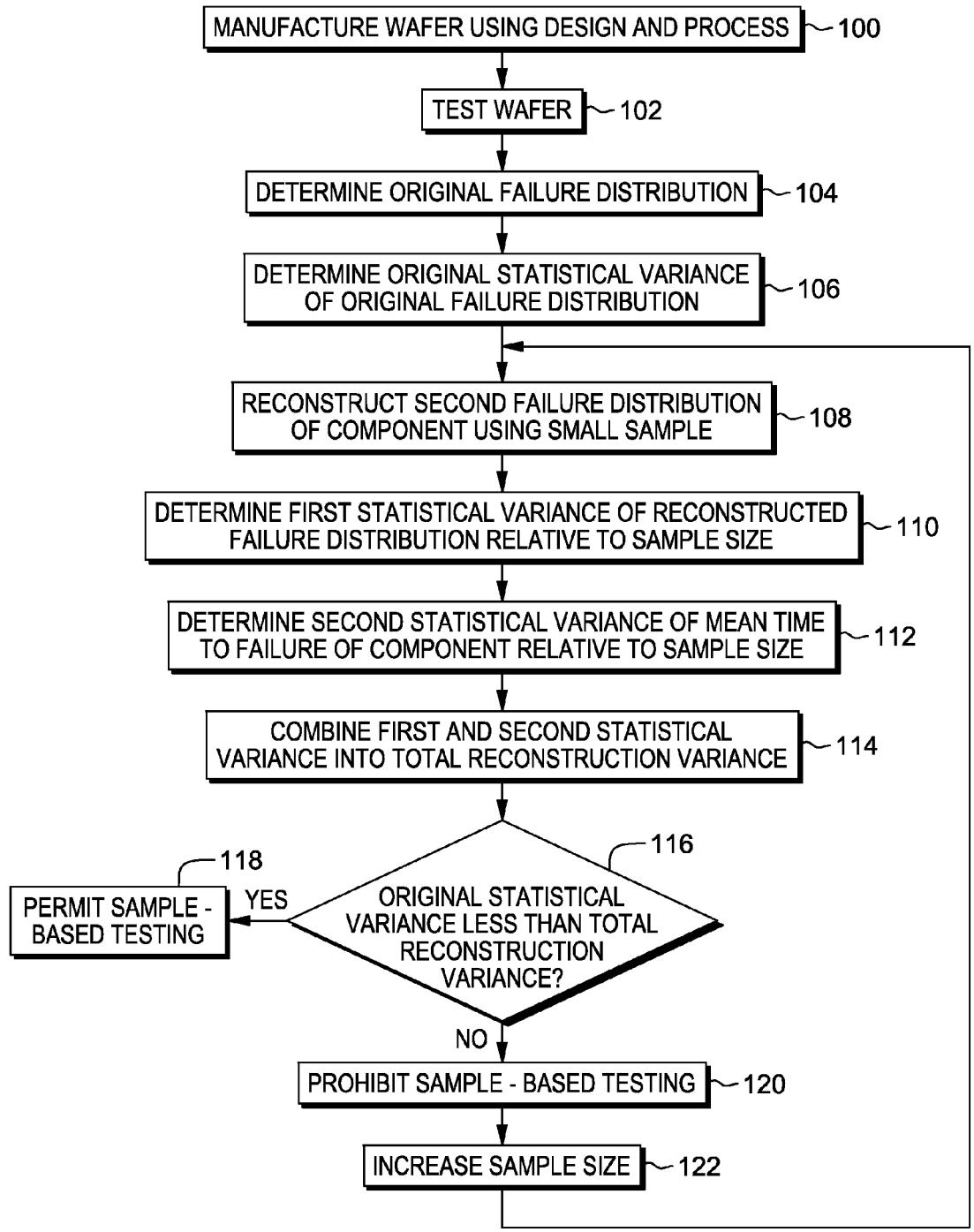
FIG. 16 is a flowchart demonstrating systems and methods herein.

FIG. 16 is a flowchart illustrating some aspects of exemplary methods, systems, and computer program products herein. In Item 100 methods manufacture a wafer using a specific a wafer design and a manufacturing process that uses wafer manufacturing machines. The wafer design can contain identically designed integrated circuit chips. In item 102, these various methods, systems, and computer program products herein test the manufactured wafer to produce test data.

In item 104, using a first, relatively very large sampling size of the test data, such methods, systems, and computer program products determine an original failure distribution of a component of the wafer (that is common to all of the integrated circuit chips, such as insulator thickness). In item 106, these methods, systems, and computer program products determine an original statistical variance of the original failure distribution of the component that occurs during the manufacturing of the wafer. This original statistical variance calculated in item 106 can be a chip-to-chip variance, a device-to-device variance, etc., and is based on empirical (actual physical) testing of the manufactured integrated circuit chips that occurs in item 102.

Additionally, in item 108 such methods perform a process of creating a reconstructed failure distribution of the component using a second, relatively much smaller sampling sizes of the test data that is hundreds to tens of thousand times less than all of the test data. More specifically, when selecting the sampling sizes in item 108, these methods select the number of integrated circuit chips per wafer to sample (that are less than all of the integrated circuit chips in the wafer design) and select the number of devices per integrated circuit chip to sample (that are less than all of the devices in the integrated circuit chips in the wafer design). Thus, while both the test data and the sample sizes comprise the test data from less than all the integrated circuit chips per wafer and less than all the devices per integrated circuit chip, all of the test data is much larger (a large multiple of (e.g., 100×, 1000×, 10,000×, 100,000×, etc.) the sampling sizes; and use of the much smaller sampling sizes can save computer resources and time when performing sample-based testing the wafer design and manufacturing process.

In order to evaluate whether it is appropriate to perform testing of the specific wafer design and manufacturing process using the reconstructed failure distribution of the component generated with the smaller sampling sizes, in item 110 these methods determine a first statistical variance of the reconstructed failure distribution relative to sample size; and, in item 112 determine a second statistical variance of a mean time to failure of the component relative to sample size, again using all of the test data. These methods then combine the first statistical variance and the second statistical variance into a total reconstruction variance in item 114.

In item 116, such methods determine whether the original statistical variance is less than the total reconstruction variance to identify whether additional wafers manufactured according to the specific wafer design and manufacturing process can be subjected to sample-based testing using the process of creating the reconstructed failure distribution with the smaller sampling sizes. Therefore, these methods prohibit such sample-based testing of the additional wafers when the original statistical variance is less than the total reconstruction variance in item 120, but permit such sample-based testing of the additional wafers when the original statistical variance is not less than the total reconstruction variance in item 118.

In additional embodiments, in item 122, these methods can alter the sample sizes to include more samples when item 116 identifies that the process of creating the reconstructed failure distribution of the component cannot be used 120, and processing loops back to item 108 to repeat the reconstruction process with a larger sample size.

Figure 17:
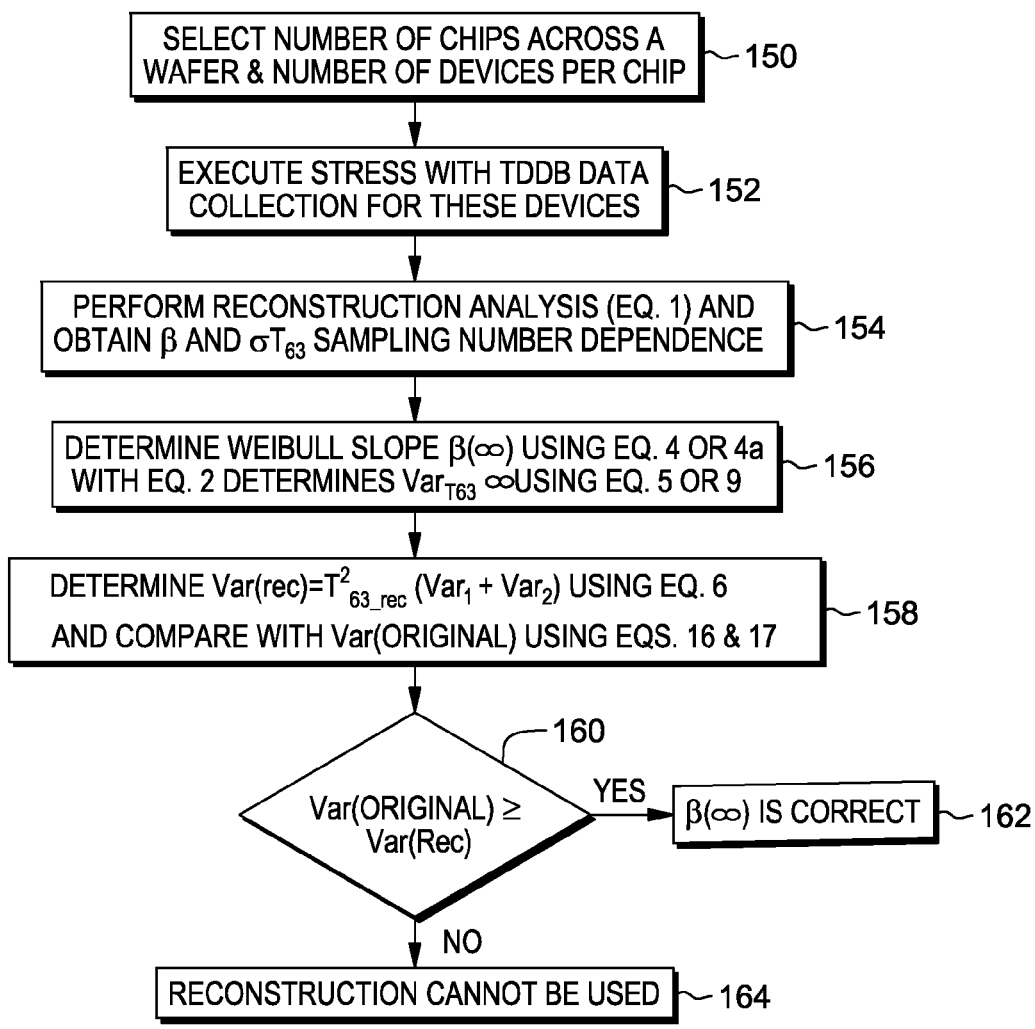
FIG. 17 is a flowchart demonstrating systems and methods herein.

FIG. 17 is a flowchart demonstrating systems and methods herein. In item 150 the number of chips across a wafer is selected and the number of devices per chip. In item 152, the systems and methods execute stress with the TDDB data collection for the devices. As shown in item 154, the systems and methods then perform a reconstruction analysis and obtain β and $\sigma_{T63}$ sampling number dependence. Further in item 156, the systems and methods determine Weibull Slope β (∞) using Eq. 4 and 4a with Eq. 2 and determines $Var_{T63\infty}$ using Eq. 5 or 8. Then in item 158, the systems and methods determine $Var_{tot\_rec} = T_{63\_Rec}^2(var_1+var_2)$ using Eq. 11 and compare with Var (original) using Eq. 12. In item 160, the systems and methods process, Var(Original)≥$Var_{tot\_rec}$. If the process determines that this is correct then, β(∞) is correct as seen in item 162. However if no then the reconstruction cannot be used, as shown in item 164.

Therefore, as shown in the comparison of FIGS. 2A and 2B, while the reconstructed Weibull distribution with (dots in FIG. 2A) and without (triangles in FIG. 2A) oxide thickness variation does not show significant differences as sampling number increases (FIG. 2A), there are differences with (dots in FIG. 2B) and without (triangles in FIG. 2B) oxide thickness in variance (standard deviation (sigma)) with sampling number (FIG. 2B). This demonstrates that a reconstructed distribution with a small sampling number can be misleading (FIG. 2A) as it masks the non-Weibull/non-Poisson area-scaling nature of underlying in-die thickness breakdown distributions (FIG. 2B).

In view of the fact that a reconstructed distribution with a small sampling number can be misleading, methods herein determine an original failure distribution of a component of the wafer (that is common to all of the integrated circuit chips, such as insulator thickness) using a first, relatively very large sampling size of the test data. These methods also determine a first statistical variance of the reconstructed failure distribution relative to sample size, which is shown as item 180 (Original Var) in FIGS. 18 and 19. The propriety of use of the reconstructed distribution with a small sampling number is judged against this original variance level 180.

Figure 18:
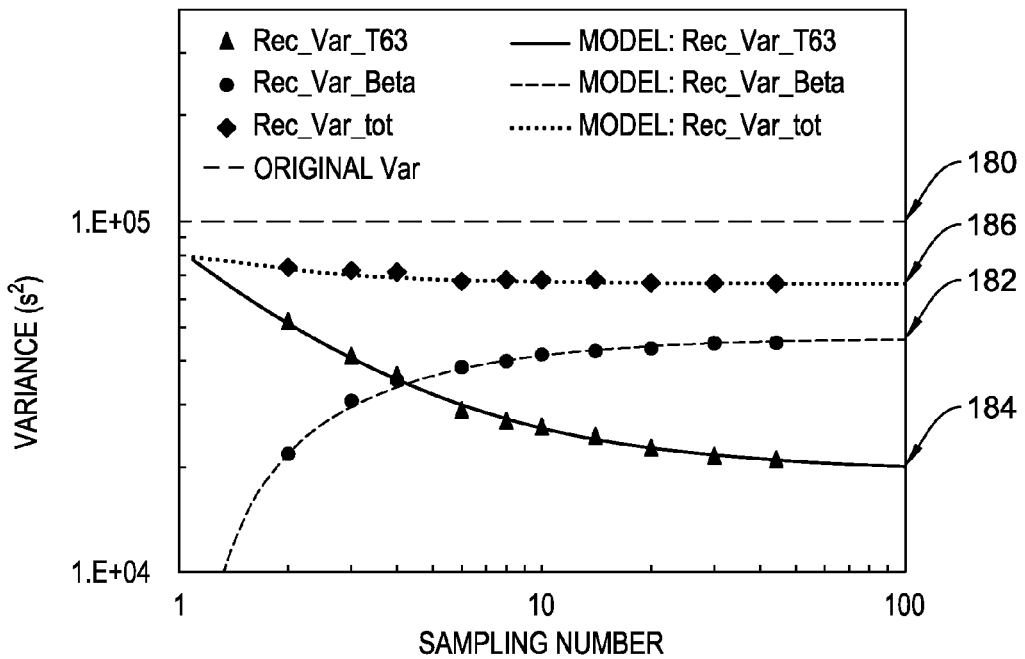
FIG. 18 is a graph demonstrating methods herein.
Figure 19:
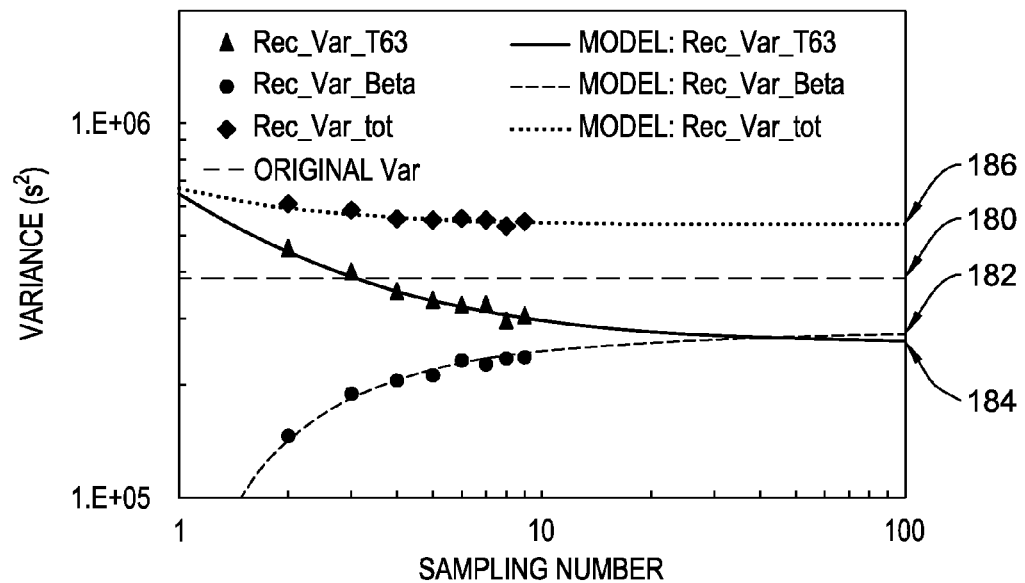
FIG. 19 is a graph demonstrating methods herein.

More specifically, these methods create a reconstructed failure distribution of the component using a second, relatively much smaller sampling sizes of the test data (that is hundreds to tens of thousand times less than all of the test data); and determine a first statistical variance of such a reconstructed failure distribution relative to sample size, which is shown as item 182 (Rec_Var_Beta) in FIGS. 18 and 19. Additionally, these methods determine a second statistical variance of the mean time to failure of the component relative to sample size, again using all of the test data, which is shown as item 184 (Rec_Var_$T_{63}$) in FIGS. 18 and 19. Then, such methods combine the first statistical variance 182 and the second statistical variance 184 into a total reconstruction variance 186 (Rec_Var_Tot, in FIGS. 18 and 19).

As can be seen by further comparison of FIGS. 18 and 19; in FIG. 18, the original statistical variance 180 is not less than the total reconstruction variance 186; while, to the contrary, in FIG. 19, the original statistical variance 180 are less than the total reconstruction variance 186. Therefore, with the results in FIG. 18, because the original statistical variance 180 is not less than the total reconstruction variance 186, additional wafers manufactured according to the specific wafer design and manufacturing process can be subjected to sample-based testing using the process of creating the reconstructed failure distribution with the smaller sampling sizes. To the contrary, with the results in FIG. 19, because the original statistical variance 180 are less than the total reconstruction variance 186, additional wafers manufactured according to the specific wafer design and manufacturing process cannot be subjected to sample-based testing using the process of creating the reconstructed failure distribution with the smaller sampling sizes.

Figure 20:
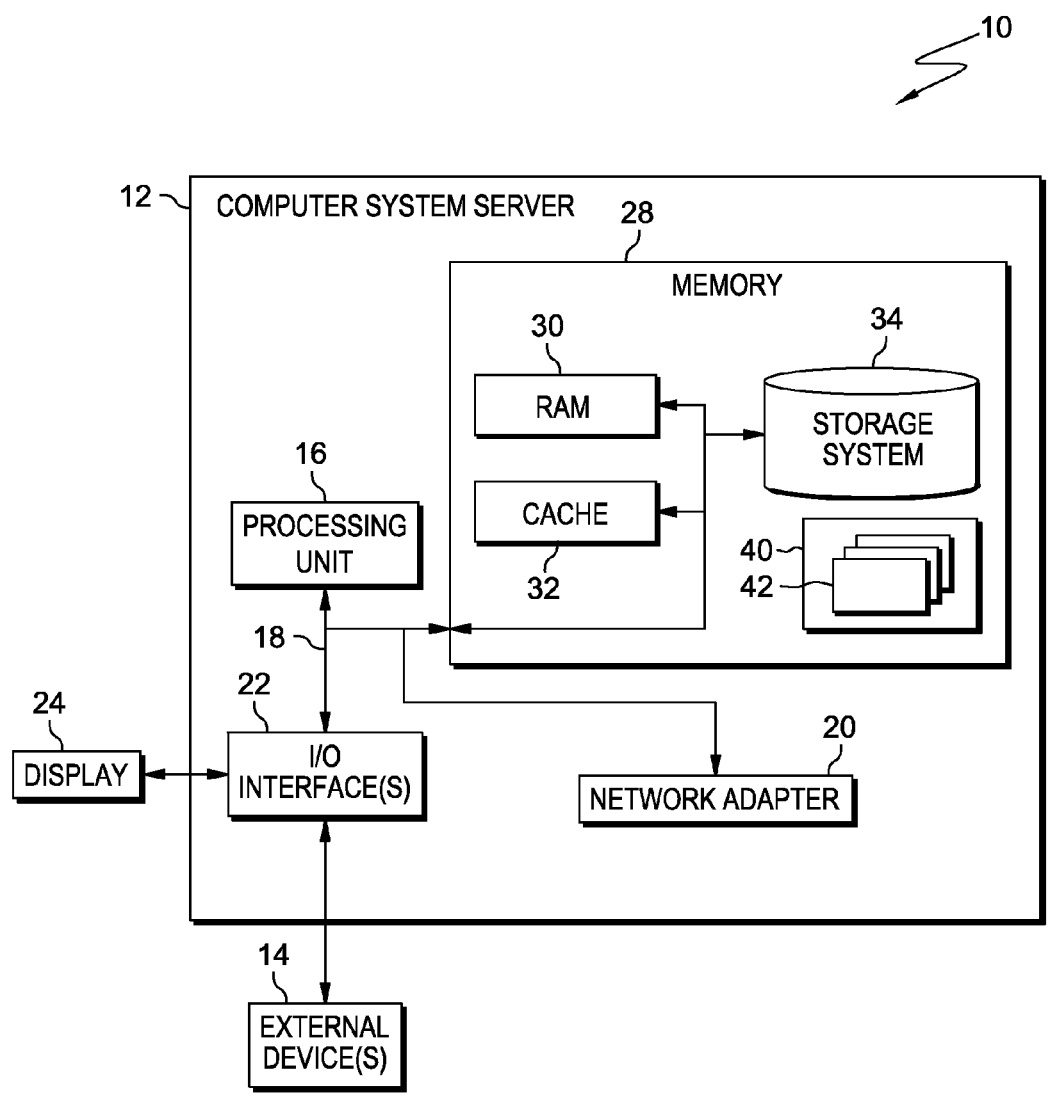
FIG. 20 is a schematic diagram of exemplary systems and devices herein.

Referring now to FIG. 20, a schematic of an example of a system 10 is shown. System 10 is only one example of a suitable system and is not intended to suggest any limitation as to the scope of use or functionality of embodiments of the invention described herein. Regardless, system 10 is capable of being implemented and/or performing any of the functionality set forth hereinabove.

In system 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in computing environments where tasks are performed by remote processing devices that are linked through a communications network. In a computing environment, program modules may be located in both local and remote computer system storage media including memory storage devices.

As shown in FIG. 20, computer system/server 12 in system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

In this application, the definition of mean variance are defined for any arbitrary distributions as follows in these equations:

$$\mu = \int xf(x)dx = \int x\frac{dF}{dx}dx \tag{13}$$

$$\text{Var} = \sigma^2 = \int (x-\mu)^2 f(x)dx = \int x^2 f(x)dx - \mu^2$$

and $$= \int x^2 \frac{dF}{dx}dx - \mu^2 \tag{14}$$

Where f(x) is the probability density function, F(x) is the cumulative probability function so that $$f(x) = \frac{dF}{dx}. \tag{15}$$

The mean is shown in this equation $$\mu = \int xf(x)dx = \int xdF = \int d(Fx) - \int Fdx \tag{16}$$

Furthermore, variance is shown in this equation $$\text{Var} = \int x^2 dF - \mu^2 = \int d(Fx^2) - \int 2xFdx - \mu^2 \tag{17}$$

Equations 16 and 17 can be solved numerically for breakdown measurements for arbitrary failure distributions with the cumulative failure fraction using Equation 18 or 19 below. In these equation I is the ith sample and N is the total number of samples $$F = \frac{i - 0.3}{N + 0.4} \tag{18}$$

$$F = \frac{i - 0.3175}{N + 0.365} \tag{19}$$

A single parameter model $\beta(n)$ for sampling-number dependence of Weibull slope, is shown in this two parameter ($\beta_\infty$ & $\sigma_0$) model in Equation 20 below.

$$\beta(n) \equiv \beta[\text{Var}^{-1}(\beta)] = \text{Var}(\beta_\infty)\left[1 - \frac{1}{n}\right] \tag{20}$$

Figure 21:
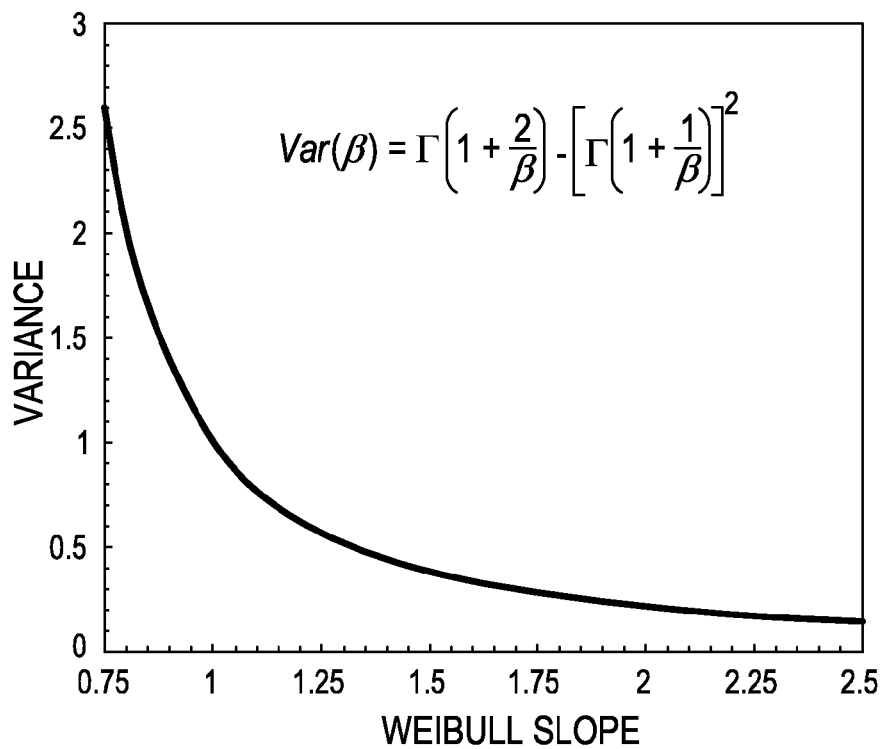
FIG. 21 is a graph demonstrating methods herein.

The one parameter ($\beta\infty$) model is shown in Equation 21 below and FIG. 21.

$$\beta(n) \equiv \beta^{-1}[\text{Var}(\beta)] = \text{Var}(\beta_\infty) - \frac{\sigma_0^2}{n} \tag{21}$$

Figure 22:
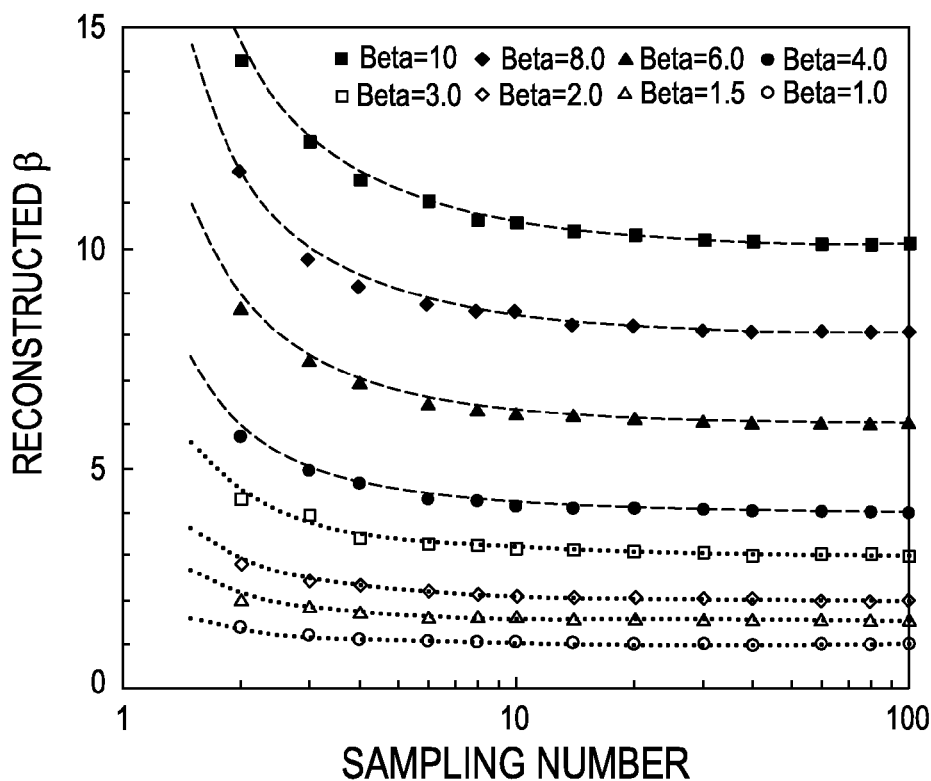
FIG. 22 is a graph demonstrating methods herein.
Figure 23A:
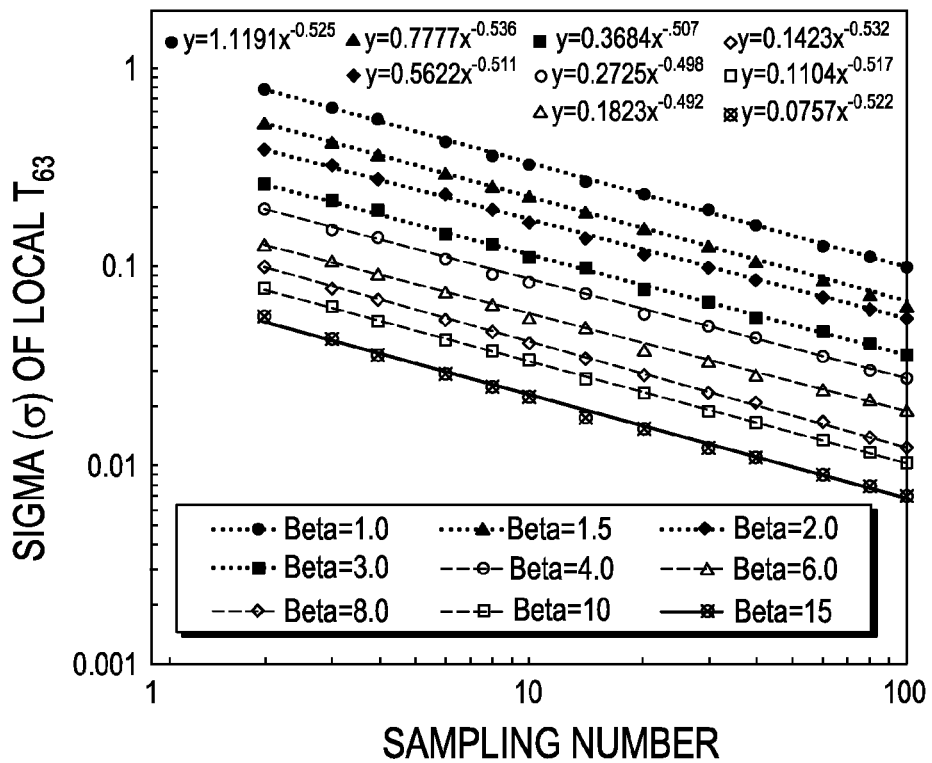
FIG. 23A-B are graphs demonstrating methods herein.
Figure 23B:
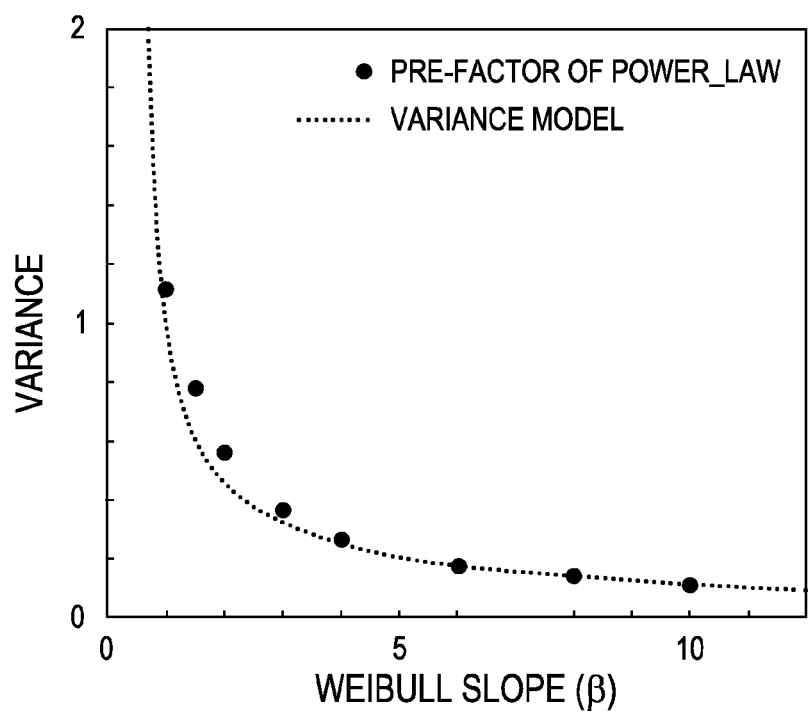

Single-parameter model for β-sampling number dependence, β(n) is shown in FIG. 22. The lines are a one-parameter model and the symbols use MC simulation. The Weibull distribution is generated randomly and divided into 100 dies and the reconstruction analysis applied to obtain β(n). The self-consistency of a single-parameter β(n) is shown in FIG. 23A-23B. The σ $T_{63\_WB}$ follows the central limit theory and the Var(β) should equal $\sigma_0^2$ are shown in FIG. 23B.

$$\mathrm{Var}_{T_{63-WB}} = \frac{\sigma_0^2}{n} \qquad (22)$$

Figure 24:
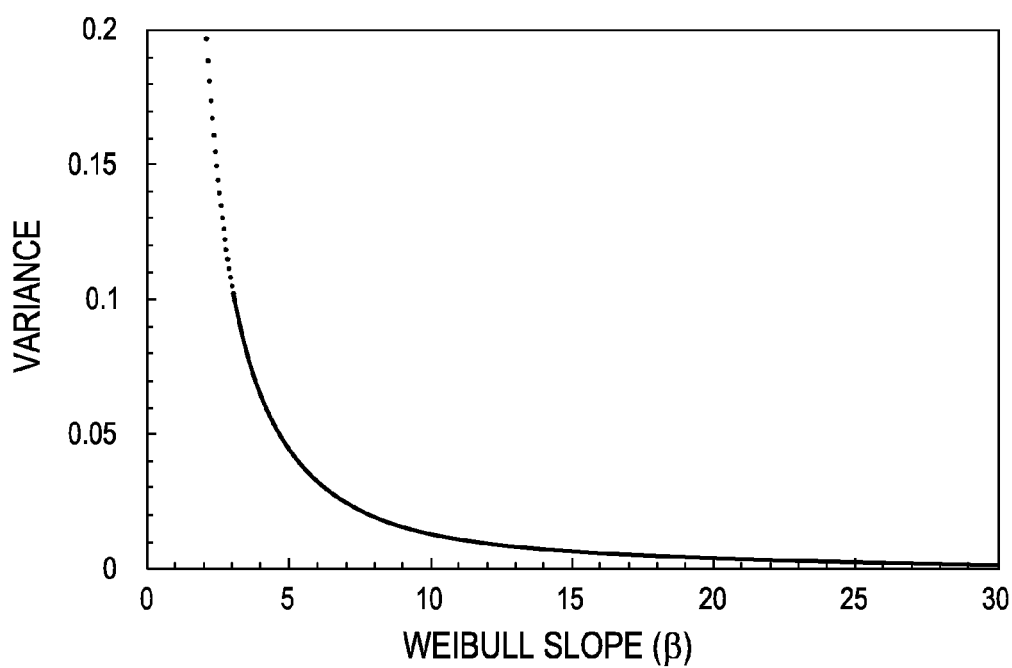
FIG. 24 is a graph demonstrating methods herein.

Piece-wise approximation of Var(β) for fast determination of Weibull slope is shown in FIG. 24. In many applications Var(β) (Eq. 3) can be approximated by Equation 23 and 24 so that β(n) can be solved analytically.

$$\sqrt{\mathrm{Var}(\beta)} = \left( \Gamma\left(1 + \frac{2}{\beta}\right) - \left[\Gamma\left(1 + \frac{1}{\beta}\right)\right]^2 \right)^{1/2} \approx \frac{\alpha}{\beta^\rho} \qquad (23)$$

$$\mathrm{Var}(\beta) = \Gamma\left(1 + \frac{2}{\beta}\right) - \left[\Gamma\left(1 + \frac{1}{\beta}\right)\right]^2 \approx \frac{\alpha^2}{\beta^{2\rho}} \qquad (24)$$

Figure 25A:
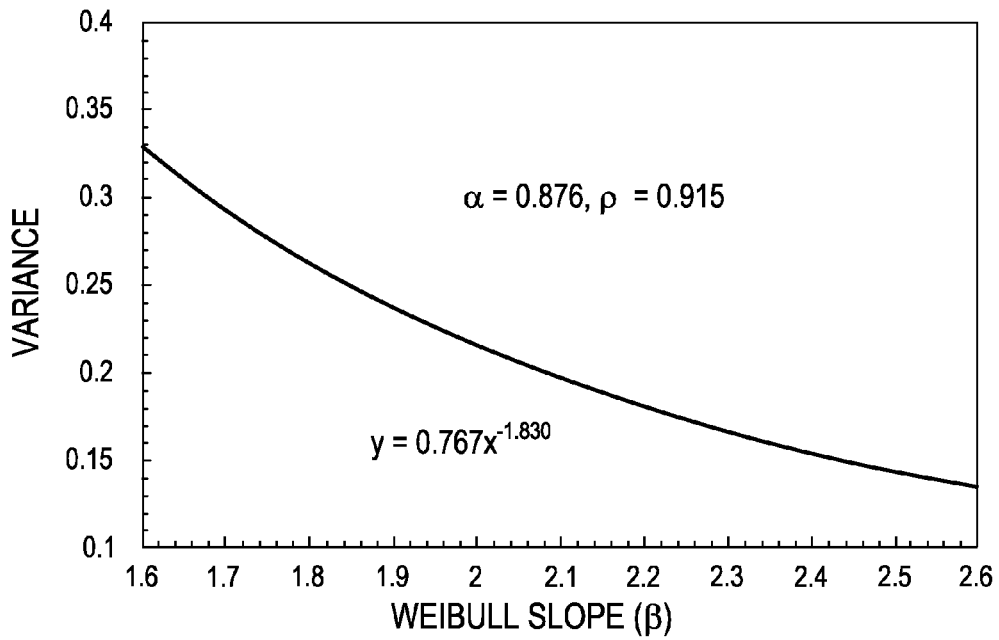
FIG. 25A-B are graphs demonstrating methods herein.
Figure 25B:
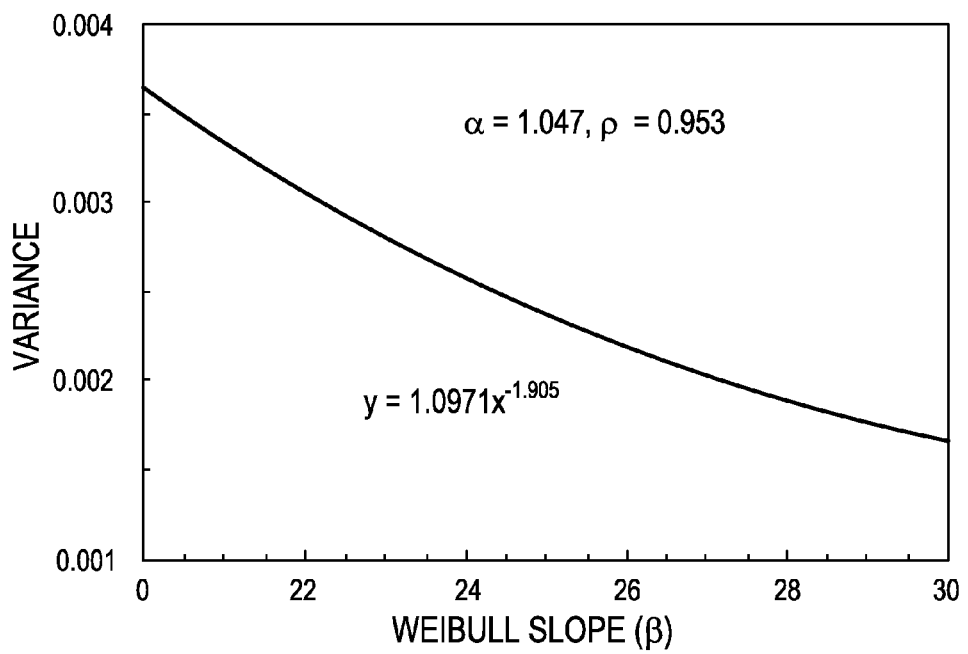

Piece-wise approximation for Var(β) can be seen in FIGS. 25A-25B where $$\beta(n) \equiv \beta^{-1}[\mathrm{Var}(\beta)] = \mathrm{Var}(\beta_\infty) - \frac{\sigma_0^2}{n} \Rightarrow \beta = \alpha^{1/\rho}\left(\frac{\alpha^2}{\beta_\infty^{2\rho}} - \frac{\sigma_0^2}{n}\right)^{-1/2\rho} \qquad (25)$$

$$\beta(n) \equiv \beta^{-1}[\mathrm{Var}(\beta)] = \mathrm{Var}(\beta_\infty)\left(1 - \frac{1}{n}\right) \Rightarrow \beta = \beta_\infty\left(1 - \frac{1}{n}\right)^{-1/2\rho}$$

Figure 26:
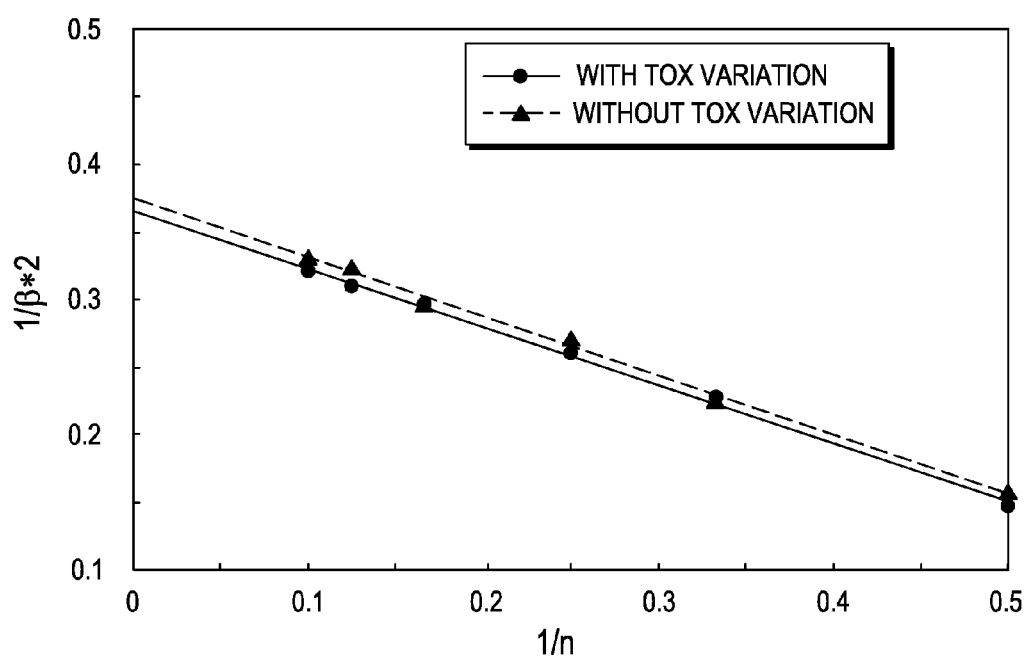
FIG. 26 is a graph demonstrating methods herein.

Extraction of 1 or 2-parameters in β(n) models is shown in FIG. 26 where the interception and slope can yield two parameters in (β$_\infty$ & σ$_0$) Equation 21 and a force-fit using Equation 22 can yield 1300.

Method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be understood that the terminology used herein is for the purpose of describing the disclosed [systems, methods and computer program products] and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   testing a wafer comprising integrated circuit chips to produce test data;
   determining an original statistical variance of an original failure distribution using the test data;
   performing a process of creating a reconstructed failure distribution using sampling sizes of the test data that are less than all of the test data;
   determining a first statistical variance of the reconstructed failure distribution relative to sample size;
   determining a second statistical variance of a mean time to failure relative to sample size using the test data;
   combining the first statistical variance and the second statistical variance into a total reconstruction variance;
   determining whether the original statistical variance is less than the total reconstruction variance to identify whether additional wafers can be subjected to sample-based testing using the process of creating the reconstructed failure distribution with the sampling sizes;
   prohibiting the sample-based testing of the additional wafers based on the original statistical variance being less than the total reconstruction variance; and
   permitting the sample-based testing of the additional wafers based on the original statistical variance not being less than the total reconstruction variance.

2. Method according to claim 1, each of the integrated circuit chips containing identically designed devices, the method further comprising:
   selecting a number of integrated circuit chips per wafer to sample in the sampling sizes that are less than all of the integrated circuit chips; and
   selecting a number of devices per integrated circuit chip to sample in the sampling sizes that are less than all of the identically designed devices in the integrated circuit chips.

3. Method according to claim 1, all of the test data being a multiple of the sampling sizes.

4. Method according to claim 1, further comprising altering the sample sizes to include more samples based on identifying that the process of creating the reconstructed failure distribution cannot be used.

5. Method according to claim 1, further comprising determining the original failure distribution based on all of the test data of the test data.

6. Method according to claim 1, each of the integrated circuit chips containing identically designed devices, all of the test data and the sample sizes comprising the test data from a limited number of integrated circuit chips per wafer that are less than all of the integrated circuit chips on the wafer and a limited number of devices per integrated circuit chip that are less than all components on the integrated circuit chips.

7. Method according to claim 1, the original statistical variance of the original failure distribution comprising at least one of:
   a chip-to-chip variance; and
   a device-to-device variance.

8. A method comprising:
   manufacturing a wafer comprising integrated circuit chips using a wafer design and a manufacturing process that uses wafer manufacturing machines;
   testing the wafer to produce test data;
   determining an original statistical variance of an original failure distribution of a component common to all of the integrated circuit chips using the test data;
   performing a process of creating a reconstructed failure distribution of the component using sampling sizes of the test data that are less than all of the test data;
   determining a first statistical variance of the reconstructed failure distribution relative to sample size;
   determining a second statistical variance of a mean time to failure of the component relative to sample size using all of the test data of the test data;
   combining the first statistical variance and the second statistical variance into a total reconstruction variance;
   determining whether the original statistical variance is less than the total reconstruction variance to identify whether additional wafers manufactured according to the wafer design and the manufacturing process can be subjected to sample-based testing using the process of creating the reconstructed failure distribution with the sampling sizes;
   prohibiting the sample-based testing of the additional wafers based on the original statistical variance being less than the total reconstruction variance; and
   permitting the sample-based testing of the additional wafers based on the original statistical variance not being less than the total reconstruction variance.

9. Method according to claim 8, each of the integrated circuit chips containing identically designed devices, the method further comprising:
   selecting a number of integrated circuit chips per wafer to sample in the sampling sizes that are less than all of the integrated circuit chips in the wafer design; and
   selecting a number of devices per integrated circuit chip to sample in the sampling sizes that are less than all of the identically designed devices in the integrated circuit chips in the wafer design.

10. Method according to claim 8, all of the test data being a multiple of the sampling sizes.

11. Method according to claim 8, further comprising altering the sample sizes to include more samples based on identifying that the process of creating the reconstructed failure distribution of the component cannot be used.

12. Method according to claim 8, further comprising determining the original failure distribution of the component of the wafer based on all of the test data of the test data.

13. Method according to claim 8, each of the integrated circuit chips containing identically designed devices, all of the test data and the sample sizes comprising the test data from a limited number of integrated circuit chips per wafer that are less than all of the integrated circuit chips on the wafer and a limited number of devices per integrated circuit chip that are less than all of the components on the integrated circuit chips.

14. Method according to claim 8, the original statistical variance of the original failure distribution comprising at least one of:
   a chip-to-chip variance; and
   a device-to-device variance.

15. A computer program product for testing wafers, the computer program product comprising a computer readable storage medium having program instructions embodied therewith, the program instructions executable by a computer to cause the computer to perform a method comprising:
   testing a wafer comprising integrated circuit chips to produce test data;
   determining an original statistical variance of an original failure distribution using the test data;
   performing a process of creating a reconstructed failure distribution using sampling sizes of the test data that are less than all of the test data;
   determining a first statistical variance of the reconstructed failure distribution relative to sample size;
   determining a second statistical variance of a mean time to failure relative to sample size using the test data;
   combining the first statistical variance and the second statistical variance into a total reconstruction variance;
   determining whether the original statistical variance is less than the total reconstruction variance to identify whether additional wafers can be subjected to sample-based testing using the process of creating the reconstructed failure distribution with the sampling sizes;
   prohibiting the sample-based testing of the additional wafers based on the original statistical variance being less than the total reconstruction variance; and
   permitting the sample-based testing of the additional wafers based on the original statistical variance not being less than the total reconstruction variance.

16. The computer program product according to claim 15, each of the integrated circuit chips containing identically designed devices, the method further comprising:
   selecting a number of integrated circuit chips per wafer to sample in the sampling sizes that are less than all of the integrated circuit chips; and
   selecting a number of devices per integrated circuit chip to sample in the sampling sizes that are less than all of the identically designed devices in the integrated circuit chips.

17. The computer program product according to claim 15, all of the test data being a multiple of the sampling sizes.

18. The computer program product according to claim 15, further comprising altering the sample sizes to include more samples based on identifying that the process of creating the reconstructed failure distribution cannot be used.

19. The computer program product according to claim 15, further comprising determining the original failure distribution based on all of the test data of the test data.

20. The computer program product according to claim 15, each of the integrated circuit chips containing identically designed devices, all of the test data and the sample sizes comprising the test data from a limited number of integrated circuit chips per wafer that are less than all of the integrated circuit chips on the wafer and a limited number of devices per integrated circuit chip that are less than all components on the integrated circuit chips.

* * * * *